(12) United States Patent
Bryzek et al.

(10) Patent No.: US 6,229,190 B1
(45) Date of Patent: May 8, 2001

(54) COMPENSATED SEMICONDUCTOR PRESSURE SENSOR

(75) Inventors: Janusz Bryzek, Fremont; David W. Burns, San Jose; Steven S. Nasiri, Saratoga; Sean S. Cahill, Palo Alto, all of CA (US)

(73) Assignee: Maxim Integrated Products, Inc., Sunnyvale, CA (US)

( * ) Notice: Subject to any disclaimer, the term of this patent is extended or adjusted under 35 U.S.C. 154(b) by 0 days.

(21) Appl. No.: 09/216,073

(22) Filed: Dec. 18, 1998

(51) Int. Cl.[7] .......................... H01L 29/82; H01L 29/84; H01L 27/20
(52) U.S. Cl. .................. 257/419; 257/254; 257/417; 438/53
(58) Field of Search ..................... 257/254, 417–419; 438/50, 53

(56) References Cited

U.S. PATENT DOCUMENTS

| | | |
|---|---|---|
| 3,247,719 | 4/1966 | Chelner . |
| 3,328,649 | 6/1967 | Rindner et al. . |
| 3,739,315 | 6/1973 | Kurtz et al. . |
| 3,994,009 | 11/1976 | Hartlaub . |
| 4,019,388 | 4/1977 | Hall, II et al. . |
| 4,023,562 | 5/1977 | Hynecek et al. . |
| 4,033,787 | 7/1977 | Marshall . |
| 4,040,297 | 8/1977 | Karsmakers et al. . |
| 4,050,049 | 9/1977 | Youmans . |
| 4,125,820 | 11/1978 | Marshall . |
| 4,129,042 | 12/1978 | Rosvold . |
| 4,229,979 | 10/1980 | Greenwood . |
| 4,236,137 | 11/1980 | Kurtz et al. . |
| 4,241,325 | 12/1980 | Di Giovanni . |
| 4,276,533 | 6/1981 | Tominaga et al. . |

(List continued on next page.)

FOREIGN PATENT DOCUMENTS

| | | |
|---|---|---|
| 4227893 | 4/1993 | (DE) . |
| 0 427 261 A2 | 11/1980 | (EP) . |
| 5807871 | 5/1983 | (EP) . |
| 0 115 074 A2 | 12/1983 | (EP) . |
| 60-233863 | 11/1985 | (EP) . |
| 0 340 904 A2 | 3/1989 | (EP) . |
| 0 427 904 A2 | 3/1989 | (EP) . |
| 0 454 901 A1 | 11/1990 | (EP) . |
| 0 500 234 A2 | 2/1992 | (EP) . |
| 96/26424 | 8/1996 | (WO) . |

*Primary Examiner*—Eddie C. Lee
*Assistant Examiner*—Allan R. Wilson
(74) *Attorney, Agent, or Firm*—Blakely, Sokoloff, Taylor & Zafman LLP

(57) ABSTRACT

A semiconductor pressure sensor compatible with fluid and gaseous media applications is described. The semiconductor pressure sensor includes a sensor capsule having a semiconductor die and a silicon cap that is bonded to the semiconductor die. The semiconductor die includes a diaphragm that incorporates piezoresistive sensors thereon, and a stress isolation mechanism for isolating the diaphragm from packaging and mounting stresses. The silicon cap includes a cavity for allowing the diaphragm to deflect. The semiconductor pressure sensor further includes a pressure port that is hermetically attached to the semiconductor die. The sensor capsule and pressure port may be incorporated into a plastic housing. In one embodiment, the silicon cap is bonded to the semiconductor die to form an integral pressure reference. In an alternative embodiment, a second pressure port is provided for allowing gage or differential pressure measurements. A technique for incorporating the piezoresistive sensors is also described. An ASIC may be optionally attached to the silicon cap, and/or active electronic circuitry may be fabricated on the semiconductor die or silicon cap. Additional coatings may be optionally applied to the pressure port and semiconductor die for enhancing chemical resistance.

47 Claims, 9 Drawing Sheets

U.S. PATENT DOCUMENTS

| | | |
|---|---|---|
| 4,295,515 | 10/1981 | Takahashi et al. . |
| 4,317,126 | 2/1982 | Gragg, Jr. . |
| 4,399,707 | 8/1983 | Wamstad . |
| 4,467,656 | 8/1984 | Mallon et al. . |
| 4,502,335 | 3/1985 | Wamstad et al. . |
| 4,609,966 | 9/1986 | Kuisma . |
| 4,618,397 * | 10/1986 | Shimizu et al. ............... 156/628 |
| 4,655,088 | 4/1987 | Adams . |
| 4,656,454 | 4/1987 | Rosenberger . |
| 4,665,754 | 5/1987 | Glenn et al. . |
| 4,686,764 | 8/1987 | Adams et al. . |
| 4,737,756 | 4/1988 | Bowman . |
| 4,763,098 | 8/1988 | Glenn et al. . |
| 4,771,639 | 9/1988 | Saigusa et al. . |
| 4,773,269 | 9/1988 | Saigusa et al. . |
| 4,790,192 | 12/1988 | Knecht et al. . |
| 4,800,758 | 1/1989 | Knecht et al. . |
| 4,802,952 * | 2/1989 | Kobori et al. ............... 156/634 |
| 4,814,856 * | 3/1989 | Kurtz et al. ............... 338/4 |
| 4,842,685 | 6/1989 | Adams . |
| 4,879,903 | 11/1989 | Ramsey et al. . |
| 4,885,621 | 12/1989 | Yoder et al. . |
| 4,905,575 | 3/1990 | Knecht et al. . |
| 4,918,992 | 4/1990 | Mathias . |
| 4,942,383 | 7/1990 | Lam et al. . |
| 4,972,716 | 11/1990 | Tobita et al. . |
| 4,977,101 | 12/1990 | Yoder et al. . |
| 4,996,627 | 2/1991 | Zias et al. . |
| 5,064,165 | 11/1991 | Jerman . |
| 5,090,247 | 2/1992 | Liebgen . |
| 5,142,912 | 9/1992 | Frische . |
| 5,156,052 | 10/1992 | Johnson et al. . |
| 5,157,972 | 10/1992 | Broden et al. . |
| 5,172,205 | 12/1992 | French et al. . |
| 5,174,156 | 12/1992 | Johnson et al. . |
| 5,177,579 | 1/1993 | Jerman . |
| 5,178,015 | 1/1993 | Loeppert et al. . |
| 5,184,107 | 2/1993 | Maurer . |
| 5,186,055 | 2/1993 | Kovacich et al. . |
| 5,188,983 | 2/1993 | Guckel et al. . |
| 5,209,118 | 5/1993 | Jerman . |
| 5,220,835 | 6/1993 | Stephan . |
| 5,257,546 | 11/1993 | Tobita et al. . |
| 5,295,395 | 3/1994 | Hocker et al. . |
| 5,318,652 | 6/1994 | Hocker et al. . |
| 5,333,504 | 8/1994 | Lutz et al. . |
| 5,412,993 * | 5/1995 | Ohtani ............... 73/727 |
| 5,412,994 | 5/1995 | Cooke et al. . |
| 5,438,877 | 8/1995 | Vowles et al. . |
| 5,454,270 | 10/1995 | Brown et al. . |
| 5,459,351 | 10/1995 | Bender . |
| 5,465,626 | 11/1995 | Brown et al. . |
| 5,477,738 | 12/1995 | Tobita et al. . |
| 5,483,834 | 1/1996 | Frick . |
| 5,509,312 | 4/1996 | Donzier et al. . |
| 5,515,732 | 5/1996 | Willcox et al. . |
| 5,539,236 | 7/1996 | Kurtz et al. . |
| 5,600,071 | 2/1997 | Sooriakumar et al. . |
| 5,646,072 | 7/1997 | Maudie et al. . |
| 5,683,594 | 11/1997 | Hocker . |
| 5,684,253 | 11/1997 | Bonne et al. . |
| 6,006,607 * | 12/1999 | Bryzek et al. ............... 73/727 |

* cited by examiner

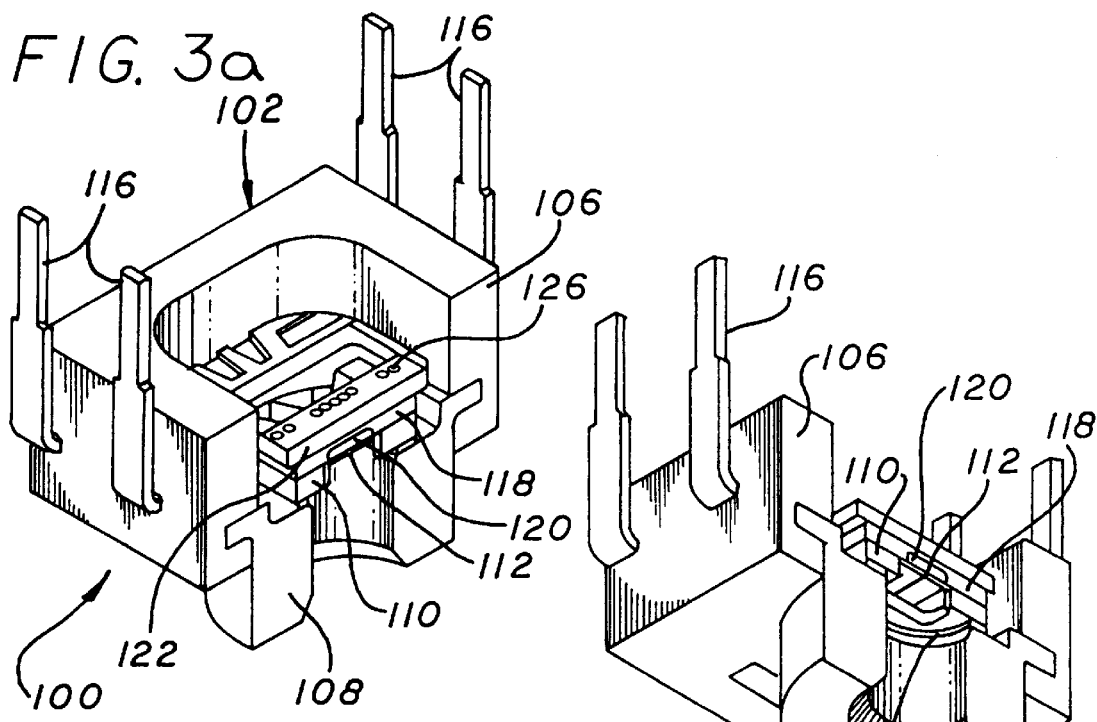
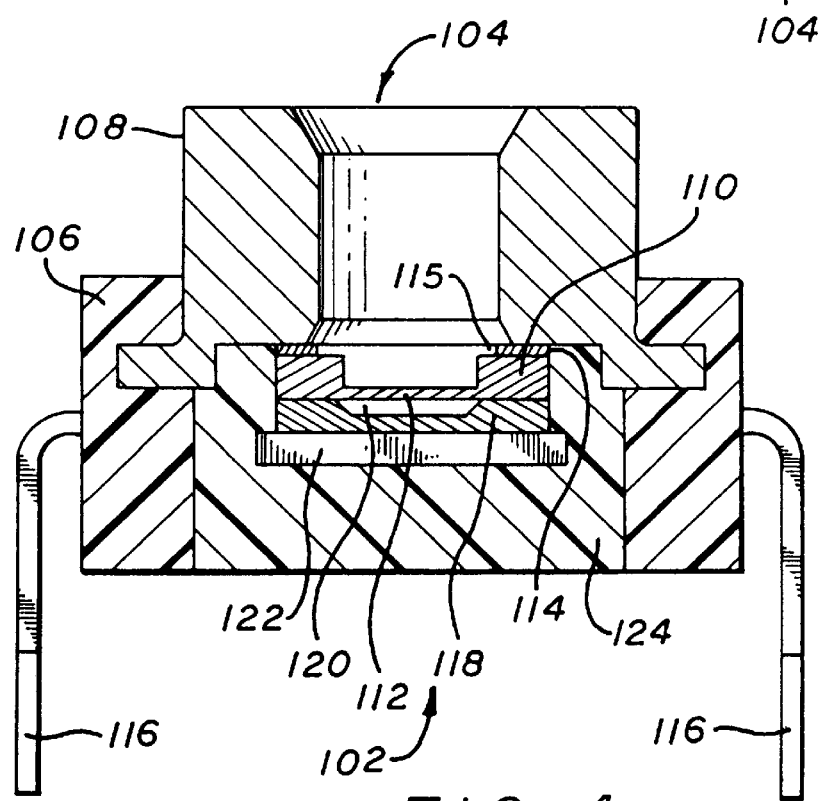

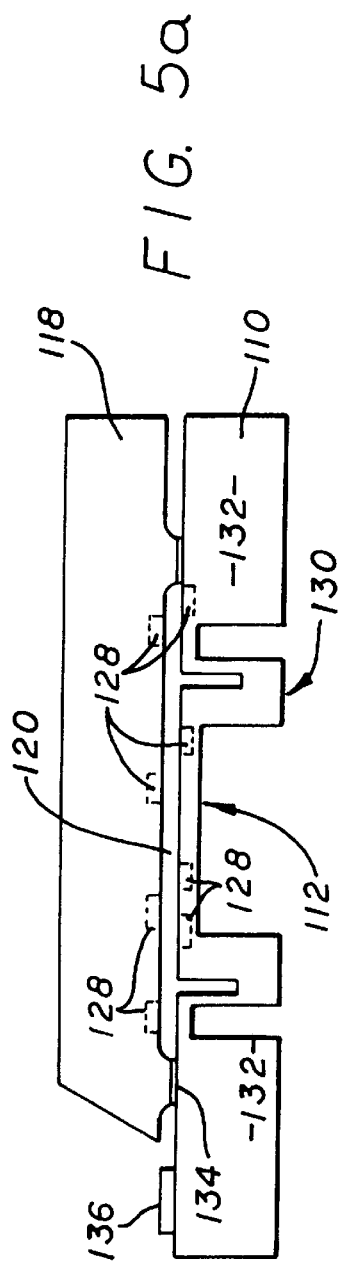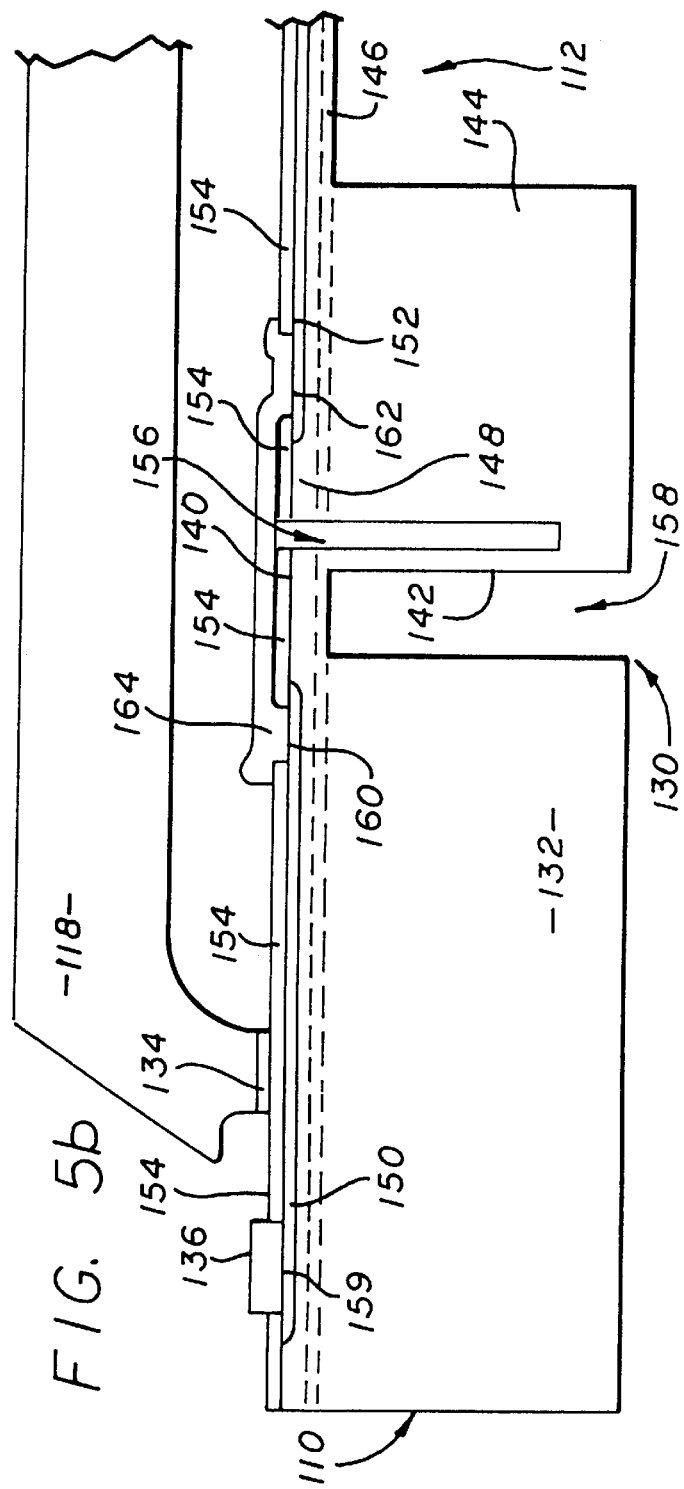

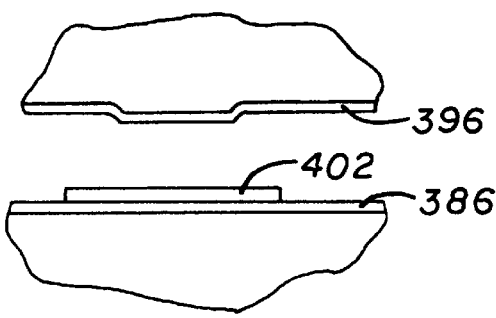
FIG. 8i
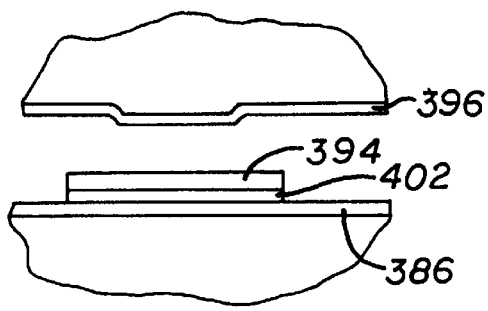
FIG. 8j
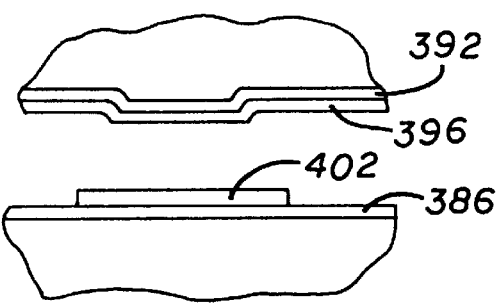
FIG. 8k
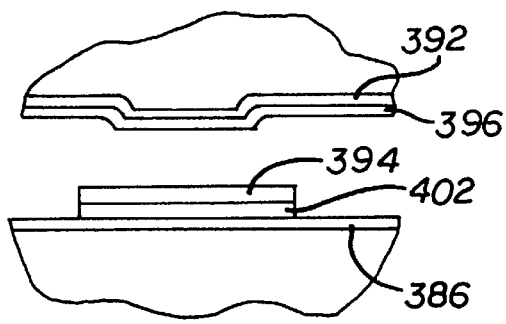
FIG. 8l
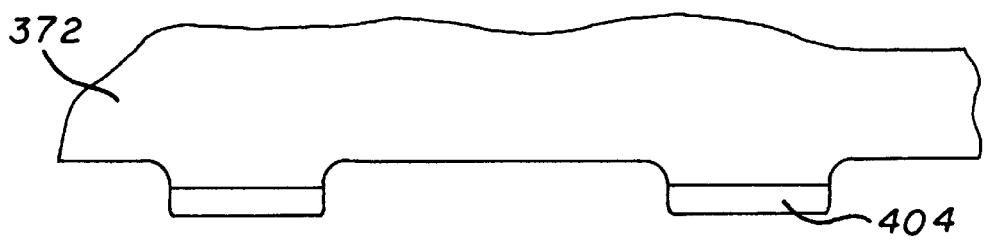
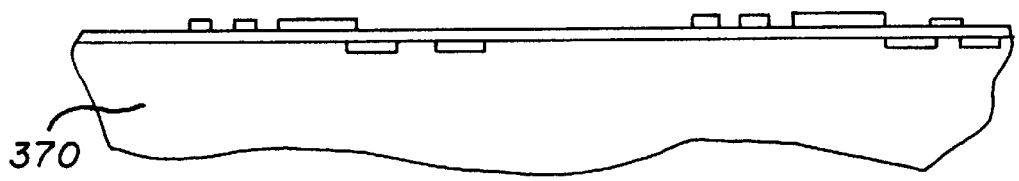
FIG. 9

COMPENSATED SEMICONDUCTOR PRESSURE SENSOR

BACKGROUND OF THE INVENTION

1. Field of the Invention

The present invention relates generally to pressure sensors, and specifically, to fluid media compatible integrated pressure sensors.

2. Background Information

FIG. 1a illustrates a schematic view of a conventional, commercially available semiconductor pressure sensor 1, which is a Motorola™ MPX4100 pressure sensor. This device integrates a silicon sensor, bipolar operational amplifier circuitry, and thin film resistor networks to provide an output signal and temperature compensation on a single die. As shown, the pressure sensor 1 includes a sensing element 2, a thin film temperature compensation and first gain stage 3, and a second gain stage and ground reference shift circuitry 4. A vacuum is sealed behind the sensor diaphragm, providing a pressure reference.

FIG. 1b illustrates a cross-sectional view of the conventional pressure sensor 1 of FIG. 1a. Referring to FIG. 1B, the pressure sensor 1 includes a die 5 having a diaphragm 6 and is attached to a backing wafer 7 to form a sealed vacuum reference cavity 8. The backing wafer 7 is attached to an epoxy plastic case 9 by way of a die bond, as shown by numeral 10. The die 5 is interconnected to a leadframe 11 by way of one or more wire bonds 12. A metal or plastic cap 13 having an opening 14 is mounted to the case 9, for directing external pressure to the sensor. The case 9 has a second opening 15 on the opposite side of the opening 14 with an associated hole through the backing wafer 7 for gage or differential pressure sensing. A fluoro or silicone gel 16 is coated over the die 5 to provide a minimal amount of protection for the die surface and wire bonds 12 from harsh environments, while allowing the pressure signal to be transmitted to the diaphragm 6.

However, the pressure sensor 1 has a primary drawback in that its operating characteristics are based on use of dry air as the pressure media. Media other than dry air may have adverse effects on sensor performance and long-term stability.

FIG. 2 is a typical prior art sensor 20 for fluid media compatible applications. The sensor package 20 includes a sensor die 21 which is placed in a metal housing 22 with hermetic glass feed-through pins 23. The sensor die 21 has an integral glass or silicon constraint bottom 24 which provides a sealing cavity 25 therebetween for vacuum reference and stress isolation from the housing. The die attach material is typically a soft material such as RTV. A metal diaphragm 26 is welded to the metal housing 22 and an inside cavity 27 formed therein is filled with oil to allow transfer of pressure to the sensor die 21. This configuration isolates the sensor die 21 from the fluid media. The use of the metal diaphragm is the primary packaging technique available today for more demanding applications, with variations in pressure and ability to apply most fluids to the sensor package. However, this type of package only generally addresses specific applications and is very expensive.

Therefore, there is a need in the industry for a pressure sensor that is compatible with fluid media as well as gaseous media and overcomes the drawbacks mentioned above.

SUMMARY OF THE INVENTION

The present invention comprises a semiconductor pressure sensor compatible with fluid and gaseous media. The semiconductor pressure sensor includes a semiconductor die and a silicon cap that is bonded to the semiconductor die, and a pressure port hermetically attached to the semiconductor die. The semiconductor die includes a diaphragm that incorporates piezoresistive sensors thereon, and a stress isolation mechanism for isolating the diaphragm from packaging and mounting stresses. The silicon cap includes a cavity for allowing the diaphragm to deflect. The sensor capsule and pressure port may be incorporated into a plastic housing. In one embodiment, an integral vacuum reference is formed within the cavity. The semiconductor die and portions of the package exposed to the fluid media are optionally coated with one or more chemical resistant coatings.

BRIEF DESCRIPTION OF THE DRAWINGS

FIGS. 3a and 3b illustrate cut-away top and bottom views of a silicon pressure sensor according to one embodiment of the present invention.

FIG. 4a illustrates a cross-sectional view of the silicon pressure sensor of FIGS. 3a and 3b where the pressure sensor capsule is also over-molded on the wire bonding side.

FIG. 5a illustrates a schematic cross section of the sensor die bonded to the silicon cap according to one embodiment of the present invention.

FIG. 5b illustrates a schematic cross-sectional view of a portion of the sensor die and silicon cap of FIG. 5a, taken on an expanded scale.

FIG. 6b illustrates a backside view of the single boss diaphragm configuration of FIG. 6a.

FIG. 6c illustrates a cross-sectional view of a single boss diaphragm configuration, according to the embodiment of FIG. 6a.

FIG. 7b illustrates a top view of the diffused piezoresistor with epi-pocket isolation according to the embodiment of FIG. 7a.

FIGS. 8a–8l illustrate several exemplary wafer-to-wafer bonding approaches using thermocompression bonding.

FIG. 9 illustrates an exemplary glass film wafer-to-wafer bonding configuration according to another embodiment of the present invention.

DETAILED DESCRIPTION

Figure 1A:
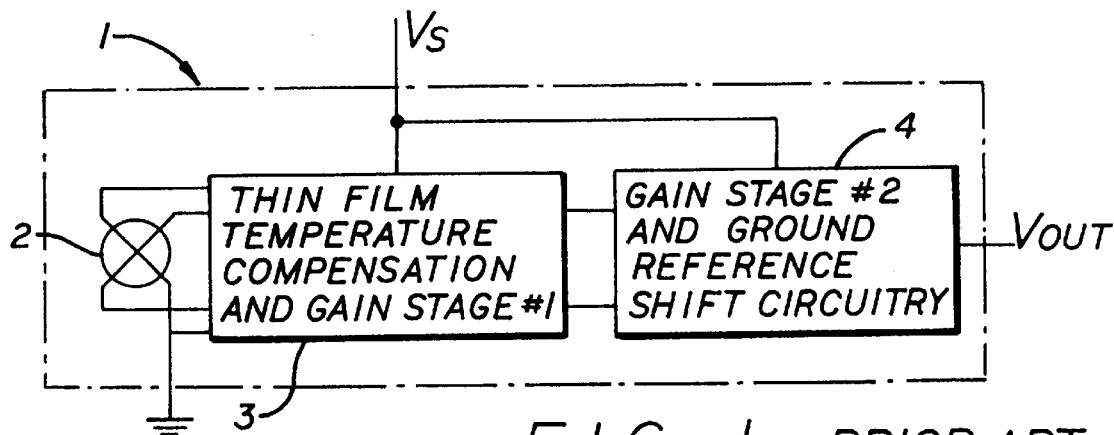
FIGS. 1a and 1b illustrate schematic and cross-sectional views of a conventional, commercially available semiconductor pressure sensor.
Figure 1B:
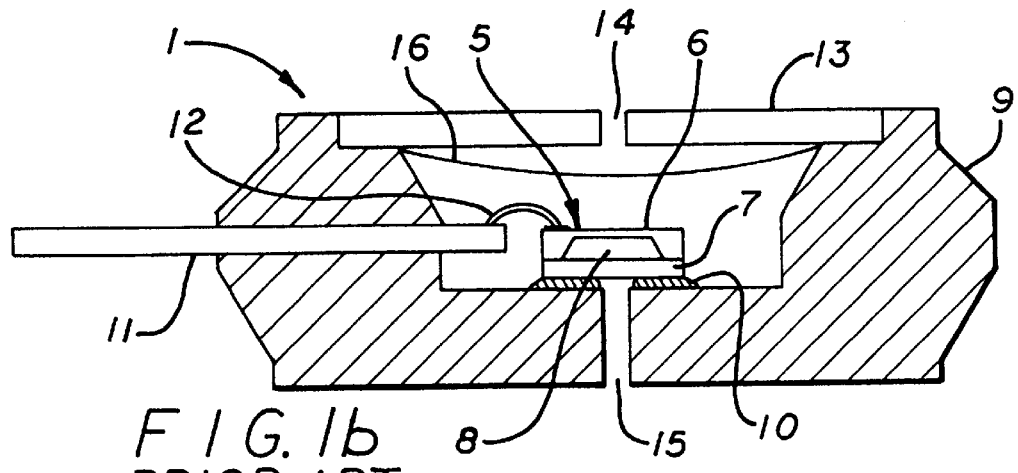
Figure 2:
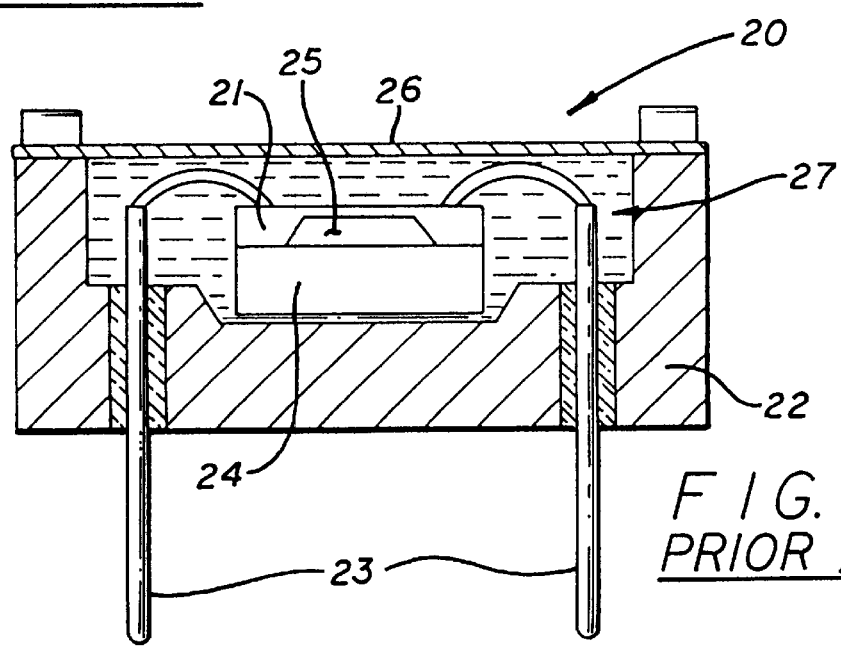
FIG. 2 illustrates a cross-sectional view of a typical prior art sensor for fluid media compatible applications.

The present invention comprises a fluid media compatible integrated absolute pressure sensor. The pressure sensor is based on state of the art technologies including bi-complementary metal-oxide semiconductor ("BiCMOS") piezoresistive sensors, deep reactive ion etching ("DRIE") and micro-machining etching techniques, low temperature wafer-to-wafer bonding, and CMOS/EEPROM signal processing for performing digital calibration and compensation.

The pressure sensor comprises a sensor capsule having a semiconductor die and a silicon cap bonded together, and a pressure port that is hermetically attached to the semiconductor die. The semiconductor die includes a diaphragm that incorporates piezoresistive sensors thereon, and a stress isolation mechanism for isolating the diaphragm from packaging and mounting stresses. The silicon cap includes a cavity for allowing the diaphragm to deflect. The sensor capsule and pressure port may be incorporated into a plastic housing. In one embodiment, an integral vacuum reference is formed within the cavity. An additional pressure port may be provided for gage or differential pressure measurements.

An application specific integrated circuit ("ASIC") may optionally be mounted on the top of the sensor capsule, which is then over-molded with an encapsulant. The ASIC may also be co-fabricated within the sensor capsule. The ASIC performs signal processing functions for compensating the electrical signal generated by the sensor (e.g., for temperature and non-linearities). An optional media-resistant coating provides additional protection for the sensor capsule and pressure port. The sensor operates from a single supply, providing a fully signal conditioned ratiometric output.

FIGS. 3a and 3b illustrate cut-away top and bottom views of a silicon pressure sensor 100 according to one embodiment of the present invention. FIG. 4a illustrates a cross-sectional view of the silicon pressure sensor. Referring to FIGS. 3a, 3b, and 4a, the silicon pressure sensor 100 has a top side 102, housing the electronics of the pressure sensor, and a bottom side 104 which is exposed to pressure media (e.g., gaseous, fluid, etc.). The pressure sensor 100 comprises a molded plastic housing 106 which embodies a metal insert 108 (hereinafter referred to as a "pressure port"). In one embodiment, the housing 106 is made from liquid crystal polymer ("LCP") plastic materials. The pressure port 108 is made from Invar 36, kovar, brass or a combination of such materials, with nickel plating, and optionally gold, for providing corrosion resistance and solderability. Alternatively, the pressure port 108 is molded into the plastic housing 106. This allows the pressure port 108 to be configured into different shapes and sizes to maintain compatibility with different interfaces. In yet another embodiment, the pressure port 108 may be threaded.

The silicon pressure sensor 100 further comprises a sensor die 110 that includes a diaphragm 112. A plurality of piezoresistors (see, e.g., FIG. 6b) is disposed on the diaphragm 112 for sensing external pressure and generating an electrical signal responsive thereto. The pressure port 108 is hermetically connected to a backside 115 of the sensor die 110 to provide a path for fluids. A preform solder washer 114 (ring), is provided for soldering and hermetically attaching the sensor die 110 directly to the pressure port 108. In one embodiment, the preform solder washer 114 contains a combination of tin and silver, and preferably 96.5% tin and 3.5% silver having a eutectic melting point of 210° C. In another embodiment, the preform solder washer 114 contains a combination of gold and tin, and preferably 80% gold and 20% tin having a eutectic reflow temperature of 280° C. In yet another embodiment, the washer contains tin and lead. The backside 115 of the sensor die 110 may optionally be metallized with chromium and platinum for enhancing solderability and providing protection against exposure to fluids. The molded plastic housing 106 also embodies a metal leadframe 116 for externally interconnecting the circuitry contained within the silicon pressure sensor 100. The metal leadframe 116 may optionally be made from Alloy 42, and optionally having electroless nickel and gold plating.

The sensor die 110 is bonded to a silicon cap 118 having a recess that forms a cavity 120 therebetween for allowing the diaphragm 112 to deflect responsive to applied pressure, and for providing a vacuum pressure reference. Preferably, the sensor die 110 is hermetically bonded to the silicon cap 118 at the wafer level prior to dicing to form an integral vacuum reference. The silicon cap 118 may be optionally bonded to active electronic circuitry 122 (e.g., an ASIC) for providing amplification and signal correction. An exemplary active electronic circuitry includes electronically trimmable circuitry which negates the need for laser trimming. The active electronic circuitry 122 may be attached to the silicon cap 118 during assembly, in which case the electronic circuitry 122 need not have the same footprint (die size). As shown in FIG. 3a, the active electronic circuitry 122 includes one or more pads 126 for connecting the active electronic circuitry to the leadframe 116. A conformal coating 124 (e.g., silicone gel, RTV material 6611, epoxy, or parylene) is applied to the topside 102 of the sensor for completing the sensor package and protecting the electronics contained therein.

Figure 4B:
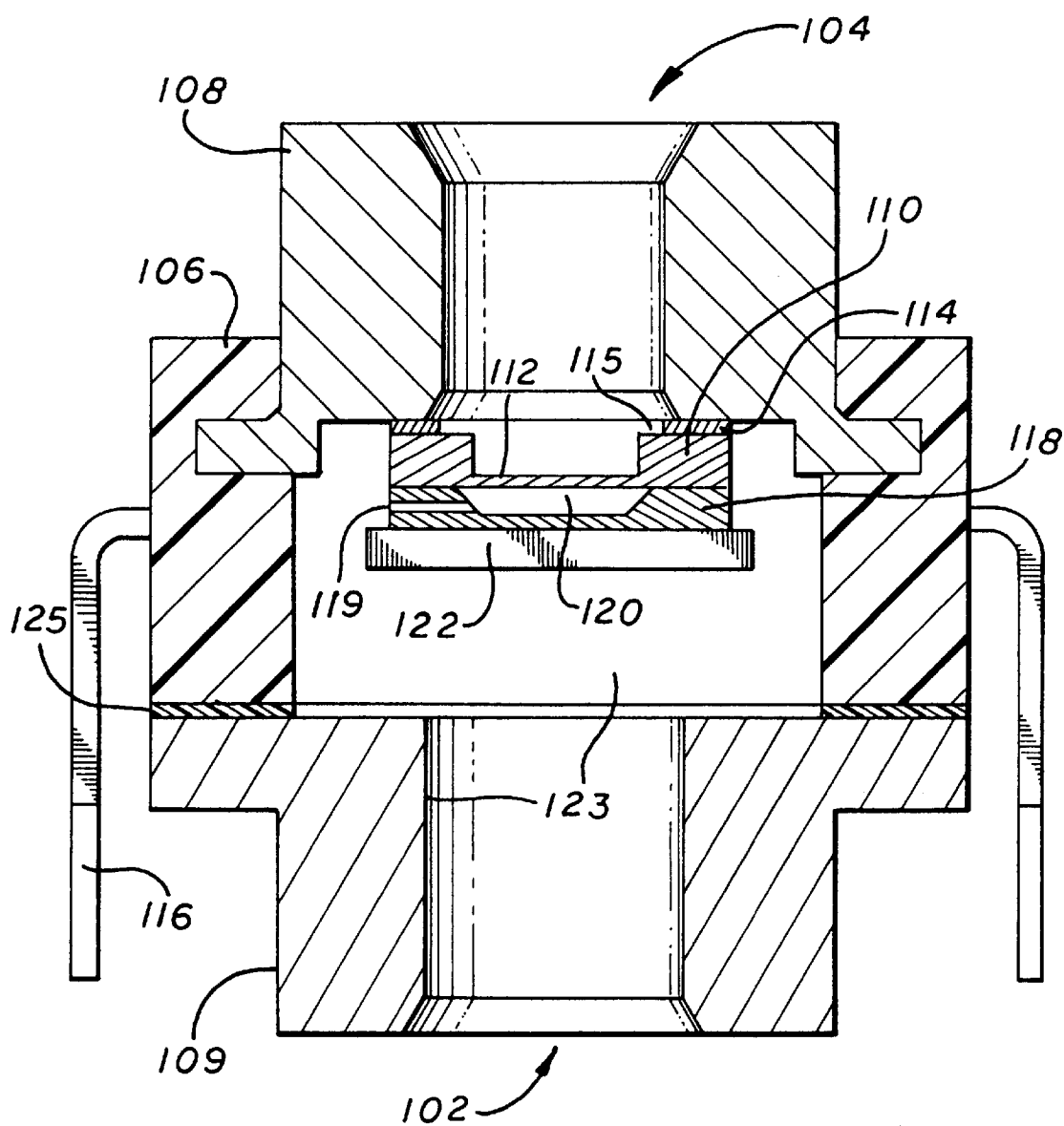
FIG. 4b illustrates a cross-sectional view of a silicon pressure sensor according to another embodiment of the present invention.

FIG. 4b illustrates a cross-sectional view of a silicon pressure sensor according to another embodiment of the present invention. In this embodiment, a second pressure port 109 is attached to the housing 106 (e.g., with RTV, epoxy, etc.) as shown by numeral 125. The silicon cap 118 includes a passageway 119 for providing differential or gage pressure measurements. A thin film coating 123 such as Teflon, Silicon Nitride, Silicon Carbide, diamond-like films, evaporated or electroless Gold, Nickel, parylene, or gel may be optionally deposited on the inside of the second pressure port 109 and internal surfaces exposed to the pressure media for additional protection. The pressure ports 108 and 109 may be configured with various fittings, such as screw threads or barbed ends for tubing.

FIG. 5a illustrates a schematic cross section of the sensor die 110 bonded to the silicon cap 118 according to one embodiment of the present invention. As shown in FIG. 5a, the sensor die 110 includes the diaphragm 112 and an integral stress isolation flexible region 130. The stress isolation region 130 protects and isolates the diaphragm 112 from thermal and mounting stresses in the peripheral (or frame) region 132 of the sensor die 110. The flexible diaphragm 112 includes piezoresistors (see, e.g., FIG. 6b) for sensing bending stresses from pressure applied to the diaphragm 112. A bond ring 134 is used to hermetically attach the cap 118 to the sensor die 110 and form a vacuum cavity 120 therebetween for providing an absolute pressure reference. By way of illustration, the bond ring 134, comprising aluminum, gold, or polysilicon, may be formed on the sensor die 110, while the silicon cap 118 may be coated with germanium, uncoated, or gold coated, respectively (see, e.g., FIGS. 8a–8l). The bond is formed at the wafer level by placing the two wafers in physical contact under elevated temperature and pressure.

In addition to or in lieu of the active electronic circuitry 122 shown in FIG. 4a, active electronic circuitry 128 may be fabricated inside the bond ring 134 of the sensor die 110 and the silicon cap 118, as shown by dashed lines 128. Fabricating the electronic circuitry within the bond ring 134 environmentally protects the same from gaseous and/or fluid media. The silicon cap 118 may contain a series of through-the-wafer etched holes for electrically connecting pads on top of the silicon cap 118 (not shown) to circuitry on the sensor die 110. Active electronic circuitry may also be fabricated outside of the bond ring 134 (e.g., top side of silicon cap 118).

FIG. 5b illustrates a schematic cross-sectional view of a portion of the sensor die 110 and silicon cap 118 of FIG. 5a, taken on an expanded scale. As shown in FIG. 5b, the stress isolation flexible region 130 includes a horizontal member 140 integral with the frame region 132, and a vertical member 142 having a first end integral with a second end of the horizontal member 140, and a second end integral with a rim region 144. Prior to formation of the horizontal and vertical members 140 and 142, and the diaphragm 112, an oxide layer 146 is formed on the silicon substrate sensor die 110 using, for example, a Silicon Implanted with Oxygen ("SIMOX") or Bonded and Etched Silicon-on-Insulator ("BESOI") technique commonly known in the art. The oxide layer 146 provides a suitable etch stop for a bottom side etch. A silicon epitaxial layer 148 (e.g., N−) is then deposited, as needed, above the oxide layer 146 to increase the thickness of the diaphragm 112. Moderately doped P-type layers 150 and 152 are formed in the epitaxial layer 148.

A second oxide layer 154 is disposed over the epitaxial layer 148 extending across the width of the sensor die 110. After depositing the second oxide layer 154, the upper trench 156 is formed, as will be described in more detail below. The second oxide layer 154 is etched in at least three places including an etch on the outside of the bond ring 134, as shown by numeral 159, and at both sides of the stress isolation region 130, as shown by numerals 160 and 162. A pad 136 is placed over the etch 159 outside of the bond ring 134, and a metal interconnect layer 164 is placed between etches 160 and 162. The doped P-type layer 150 connects the metal interconnect layer 164 at numeral 160, under the bond ring 134, to the pad 136. The doped P-type layer 152 connects the metal interconnect layer 164 at numeral 162 to circuitry in the diaphragm region 112 such as a piezoresistor (see, e.g., FIG. 6b). This provides interconnection between the piezoresistors disposed on the diaphragm 112 (and other circuitry inside the bond ring 134) and one or more pads 136 outside of the bond ring 134. The second oxide layer 154 also isolates the P-type layer 150 from the eutectic bond ring 134.

The horizontal and vertical members 140 and 142 are formed by vertically etching upper and lower trenches 156 and 158 from the top and the bottom of the sensor die 110, respectively. A series of silicon and oxide etch steps are utilized to complete the upper trench 156. Formation of the horizontal and vertical members 140 and 142 is achieved using an etching process such as, but not limited or restricted to, DRIE of silicon, a known etching technique which allows deep trenches to be etched in silicon with high aspect ratios and nearly vertical walls on each side of the wafer. The pressure-sensitive diaphragm 112 can also be etched using the DRIE technique, and may be done at the same time as the backside etch used to form the horizontal member 140.

Accuracy in the thickness of the horizontal member 140 and deformable diaphragm 112 is enhanced by the inclusion of the oxide layer 146 at a depth from the top surface equal to the desired thickness of the diaphragm, since the etch rate of such oxide is much slower than that of bulk silicon. Though silicon-on-insulator ("SOI") material is used in cases where a thin, highly uniform diaphragm 112 is desired, standard material (non-SOI) may be used in conjunction with a timed etch to provide a thicker diaphragm.

In one embodiment, the horizontal and vertical members 140 and 142 each have an aspect ratio (length to thickness) of approximately 10 to 1. That is, the length of each member is approximately ten times the thickness of the respective member, thereby providing good flexibility to confine externally generated stresses to the frame region 132 only. Other aspect ratios, as low as 1:1 or greater than 10:1, may be used depending on a number of factors including, but not limited to, the amount of stress that the frame region 132 may be subjected to, the thickness of the diaphragm 112, etc. The stress isolation flexible region 130 so formed is integral with the outer frame region 132. The horizontal and vertical members 140 and 142 support a nominally rigid rim region 144 with the same providing an isolated, rigid support for the pressure-sensitive diaphragm 112.

Figure 6A:
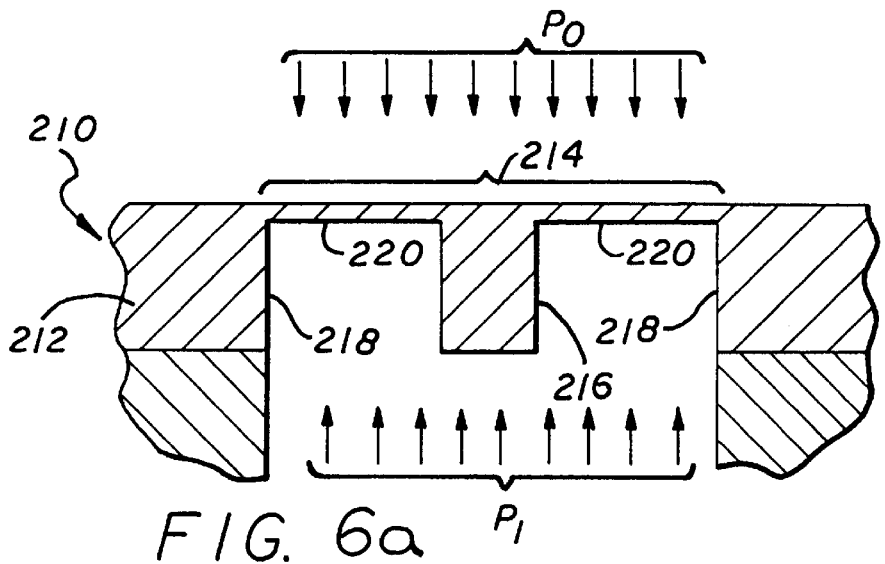
FIG. 6a illustrates a cross-sectional view of a single boss diaphragm configuration of a sensor die according to one embodiment of the present invention.

Referring now to FIG. 6a, a cross-sectional view of a single boss diaphragm configuration of a sensor die 210 may be seen. This is an alternative embodiment of the diaphragm 112 shown in FIG. 4a. The sensor die 210 may incorporate features described above with respect to FIGS. 3 through 5 (e.g., stress isolation region). In this embodiment, the sensor die 210 includes a rim region 212 and a diaphragm 214, which is supported by the rim region 212. The diaphragm 214 is exposed to applied pressure on one or both sides (e.g., $P_1$ and/or $P_0$). The diaphragm 214 is substantially planar and includes a nominally rigid member 216 (hereinafter referred to as a "boss") of increased thickness placed substantially in the mid-section or axis of the pressure sensor 210. The diaphragm 214 has a smaller thickness in a region 220 (hereinafter referred to as "thinner region") located between the boss 216 and an inner surface 218 of the rim region 212. The boss 216 locally stiffens the diaphragm 214, while focusing bending stresses on the thinner region 220.

Figure 6B:
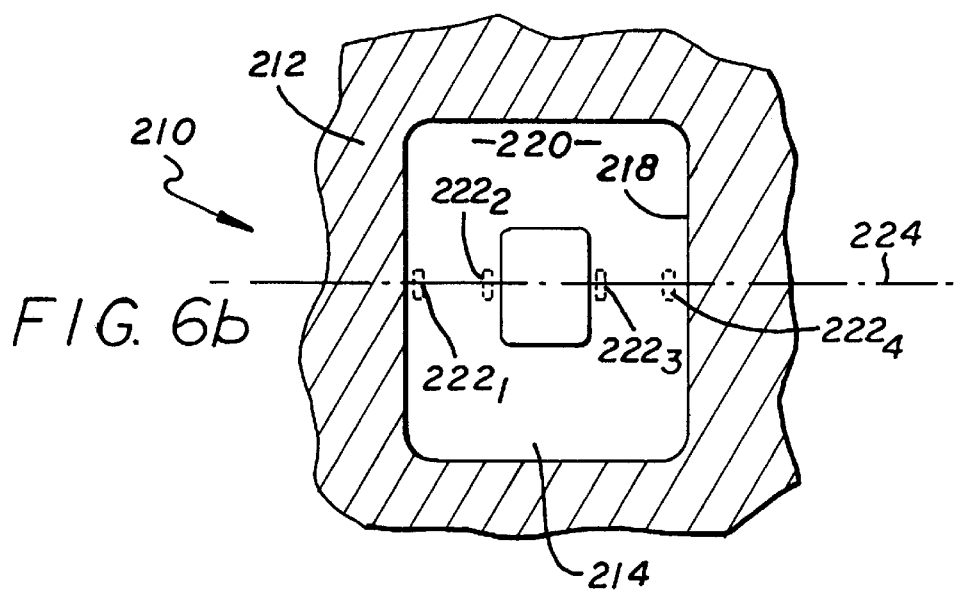

FIG. 6b illustrates a backside view of the single boss diaphragm configuration of FIG. 6a. This view shows a single boss 216 centrally located on a backside of the diaphragm 214. Four piezoresistors $222_{1-4}$ are disposed on the topside of the diaphragm 214 (shown by dashed lines) along a central axis 224, and are connected in a Wheatstone bridge configuration. Two of the piezoresistors $222_2$ and $222_3$ are placed in the thinner region 220 of tensile stress (near the boss 216), while the other two piezoresistors $222_1$ and $222_4$ are placed in the thinner region 220 of compressive stress (near the inner surface 218 of the rim 212) with positive pressure applied to the bottom of the diaphragm 214.

The piezoresistors $222_{1-4}$ are all similarly aligned, i.e., they are either all perpendicular to the axis 224 (as depicted) or all parallel to the axis 224. Orienting the piezoresistors $222_{1-4}$ in the same direction cancels out common-mode stress effects due to packaging and mounting stresses while still providing high sensitivity. Axial stresses (horizontal and/or vertical) from packaging and temperature effects vary the resistance values of the four resistors in the same way, thereby canceling such unwanted effects. A pressure differential across the diaphragm 214 causes the resistances of the two resistors in opposite legs of the Wheatstone bridge to increase, and the resistances of the other two resistors to decrease, resulting in a differential output voltage of the Wheatstone bridge which is a direct measure of the applied pressure.

Figure 6C:
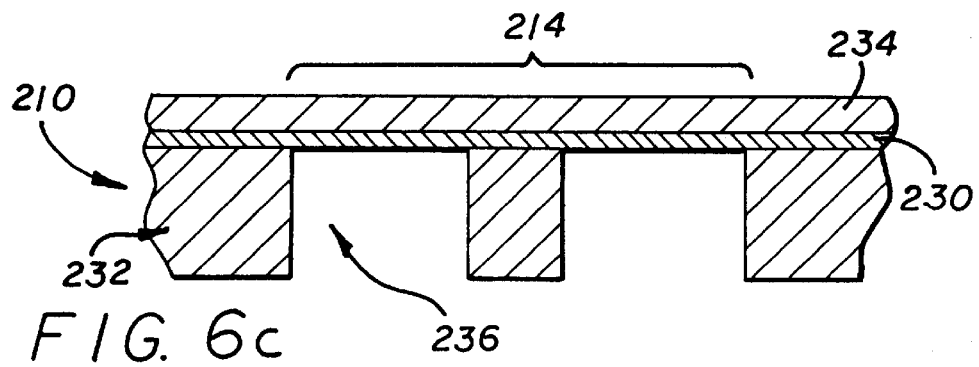

FIG. 6c illustrates a cross-sectional view of a single boss diaphragm configuration, according to the embodiment of FIG. 6a. Referring to FIG. 6c, the sensor die 210 is formed by first depositing or growing an oxide layer 230 on a substrate 232, forming a silicon layer 234 on the oxide layer 230 by a wafer bonding and etch-back technique, and masking and etching the back side 236 of the substrate 232 to form the diaphragm 214. The buried oxide layer 230 acts as an automatic etch stop to provide uniformity in the depth of the etch. In a preferred embodiment, the substrate 232 is etched from the back side 236 using the DRIE technique to form substantially vertical sidewalls of the boss 216. For high-pressure designs, the area of the diaphragm 214 may be decreased and/or its thickness may be increased. An epitaxial silicon layer, for example, may be deposited on the silicon layer 234 to achieve this additional thickness. For higher pressure ranges, where the diaphragm 214 is thicker, the etch stop oxide layer 230 may not be required.

The present invention provides improved pressure non-linearity with a large output signal in response to applied pressure, while providing a higher degree of common-mode cancellation of detrimental effects due to temperature, package induced stresses, and mounting stresses. The source of non-linearity is typically due to stretching of the mid-plane of the diaphragm with large full-scale diaphragm displacements. The boss 216 stiffens the diaphragm, thereby reducing the deflection of the diaphragm which, in turn, improves linearity.

Figure 7A:
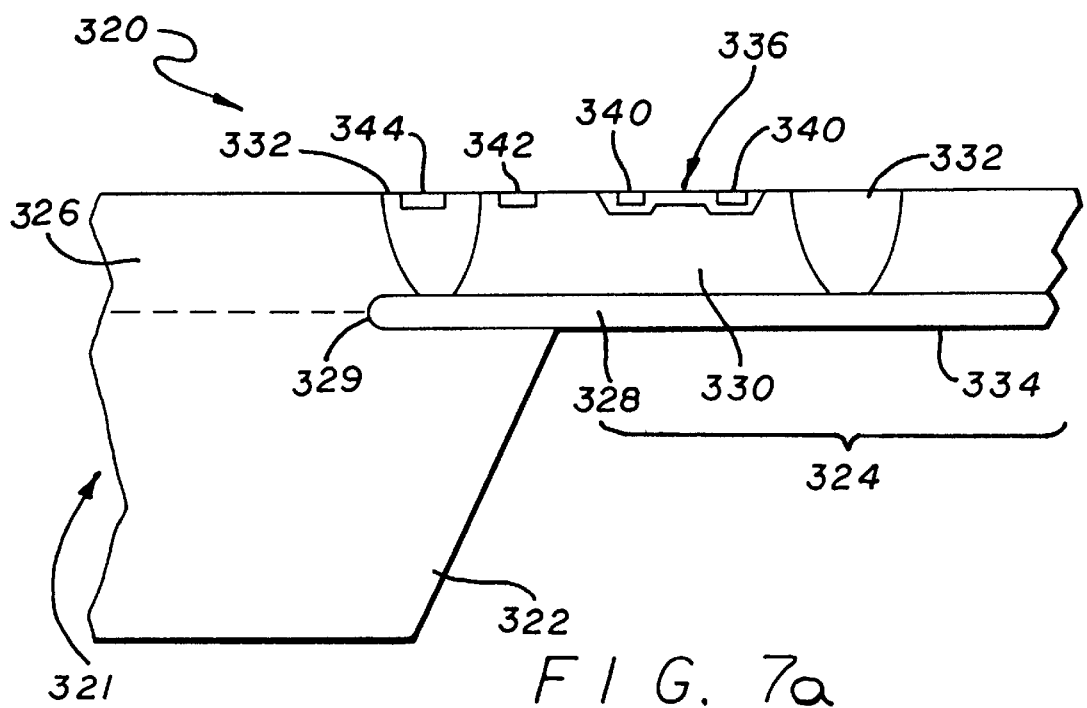
FIG. 7a illustrates a cross-sectional view of a portion of a piezoresistive sensor according to a preferred embodiment of the present invention.

FIG. 7a illustrates a cross-sectional view of a portion of a piezoresistive sensor 320 according to a preferred embodiment of the present invention. In this embodiment, the piezoresistive sensor 320 is formed by providing a substrate 321 (e.g., P-type), forming a layer 328 (either P-type or N-type) by ion-implantation on top of the substrate 321 extending across the area of the substrate, or at least a portion thereof such as in the region in which a deformable member 324 (e.g., diaphragm) will be formed, and then depositing an N– epitaxial layer 326 (hereinafter referred to as "epi-layer") on the layer 328. The layer 328 may be locally formed, as shown by numeral 329, prior to depositing the epi-layer 326.

An N– epi-pocket 330 is formed within the epi-layer 326 by surrounding a part of the epi-layer 326 with a P– sinker diffusion region 332. The sinker diffused region 332 extends from the semiconductor surface through the N– epi-layer 326 to the P– buried layer 328, or the substrate which, in the absence of the buried layer, would preferably be a P– substrate. Also shown is a diffused piezoresistor 336 (e.g., P-type) formed in the sub-surface of the epi-pocket 330. Several epi-pockets (e.g., four) may be formed in the deformable member or diaphragm region 324, with each piezoresistor disposed in a separate epi-pocket. In another embodiment, all piezoresistors are disposed in one epi-pocket.

The substrate 321 is then etched from the bottom side (e.g., using a wet etch) up to the buried layer 328, for example, which acts as an etch stop, to form a deformable diaphragm region 324 and a rim region 322. Consequently, the diaphragm region 324 includes the buried layer 328 and the epi-layer 326 formed on top of the buried layer 328. In another embodiment, the substrate 321 may be etched from the bottom side short of the layer 328 using a dry etch with possibly a buried oxide etch stop, in which case the diaphragm region 324 will include the epi-layer 326, the buried layer 328, and an oxide layer (not shown).

Figure 7B:
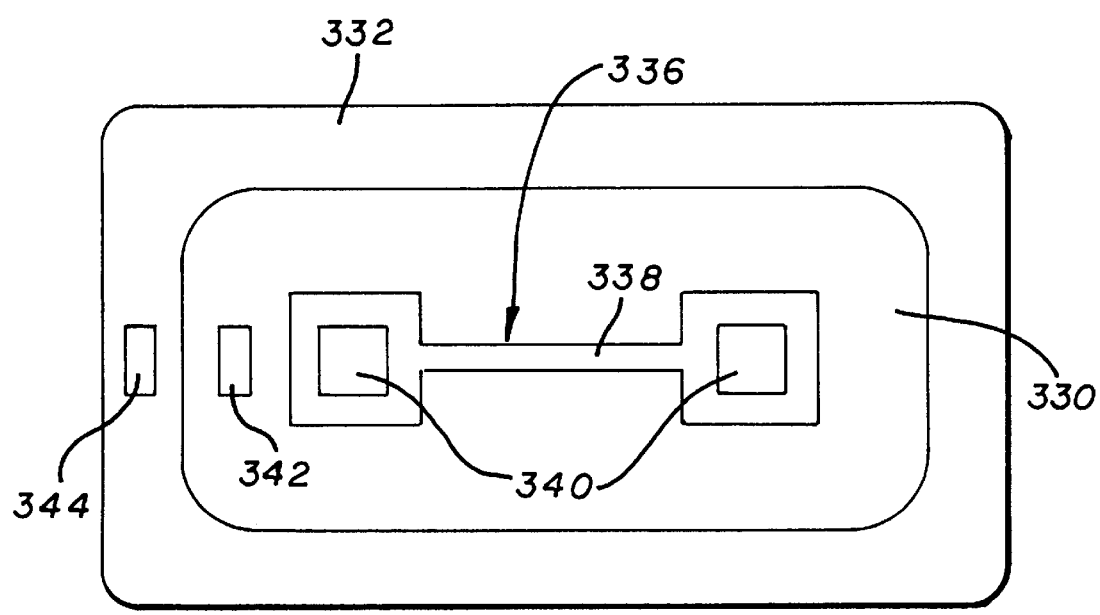

FIG. 7b illustrates a top view of the diffused piezoresistor 336 with epi-pocket isolation according to the embodiment of FIG. 7a. Referring to FIGS. 7a and 7b, the piezoresistor 336 is comprised of an elongated, diffused region 338, with highly doped P+ contact regions 340 at each end to allow interconnection with the diffused piezoresistor 336. It is important to note that the shape of the piezoresistor 336 may vary. The N– epi-pocket 330 surrounds the piezoresistor 336 and includes a diffused N+ contact region 342 for electrically connecting the epi-pocket 330 to a sufficiently high voltage, such as the highest potential on the chip, the highest bridge voltage, or to the highest local potential of the piezoresistor 336. This provides electrical isolation of the piezoresistor 336 in addition to reducing and controlling voltage sensitivity. The P– sinker diffused region 332 surrounds the epi-pocket 330. A P+ contact region 344 is located in the sinker diffused region 332 for electrically connecting the same to ground.

Epi-pocket isolation involves providing reverse-biased p-n junctions to isolate active device areas from one another. In this particular implementation, epi-pocket isolation effectively separates the precision piezoresistors from other portions of the piezoresistive sensor 320. Junction isolation is achieved by biasing the N– epi-pocket 330 at an electric potential equal to or larger than the voltages at either end of the P-type piezoresistors. A P+ contact region 344 allows the P– sinker diffused region 332 to be placed at a low potential or ground, providing additional electrical isolation and an effective case ground.

Alternatively, the conductivity types of one or more of the substrate 321, buried layer 328, epi-layer 326, sinker diffused region 332, and piezoresistor 336 may be reversed. In the preferred embodiment, P-type piezoresistors are preferred over N-type piezoresistors. It is to be appreciated that the piezoresistive sensor 320 of FIG. 7a, which includes a P– buried layer 328, N– epi-layer 326, P– sinker diffused region 332, and a P-type piezoresistor 336, may be formed on an N– substrate 321.

Figure 7C:
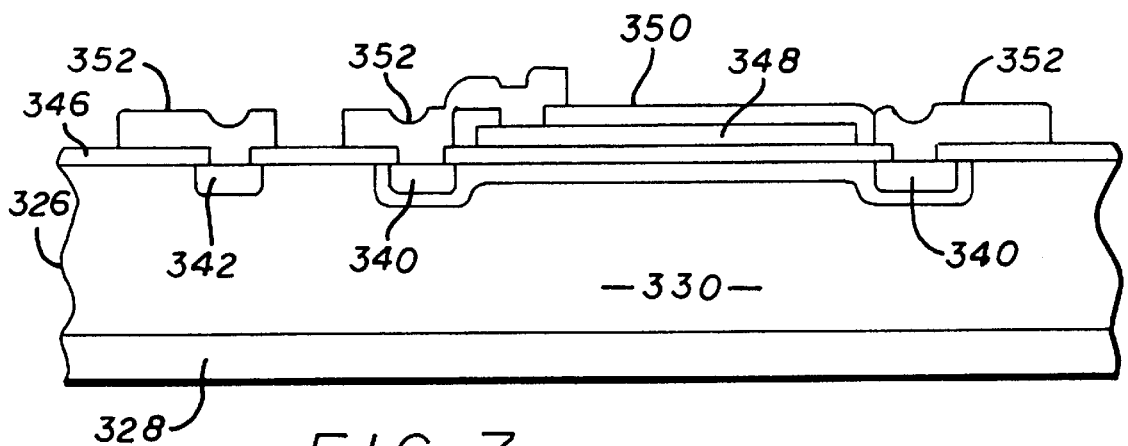
FIG. 7c illustrates a schematic cross section of a diffused piezoresistor in an epi-pocket with a polysilicon shield thereon.

FIG. 7c is a schematic cross section of a diffused piezoresistor in an epi-pocket with a polysilicon shield 348 thereon. After the piezoresistors are formed, an oxide layer 346 is deposited or grown over the epi-layer 326. Then, a conductive layer (e.g., polysilicon) is deposited and patterned to form a polysilicon shield 348 over the oxide layer 346 between the P+ contact regions 340. A second oxide layer 350 is then deposited or grown over the polysilicon shield 348. The oxide layers are masked and etched to expose the N+ contact region 342 and the P+ contact regions 340, and a metallization layer 352 is deposited and patterned to provide certain circuit interconnects. This locally connects the polysilicon shield 348 to a P+ contact region 340 of the piezoresistor 336. Consequently, the polysilicon shield 348 is insulated from the piezoresistor by the oxide layer 346, but locally connected to the same potential as one end of the P-type piezoresistor 336 to provide an electrostatic shield over the piezoresistor.

In another embodiment, the polysilicon shield 348 may be connected to the same potential as the epi-pocket 330 or can be grounded. As the N– epi-pocket 330 provides electrical isolation from the bottom and sides of the piezoresistor sensor 320, the polysilicon shield 348 provides electrical isolation from the top. The shield 348 may alternatively be composed of, for example, metal, CrSi, NiCr or any semiconductor-compatible metal. The polysilicon shield enhances piezoresistor performance by controlling local electric fields, controlling breakdown, and reducing the impact of ionic contamination. In particular, the polysilicon shield provides control of the electrical field distribution in the oxide above the piezoresistor 336, reducing the sensitivity to voltage variations in the biasing circuitry and radiated RFI.

Figure 7D:
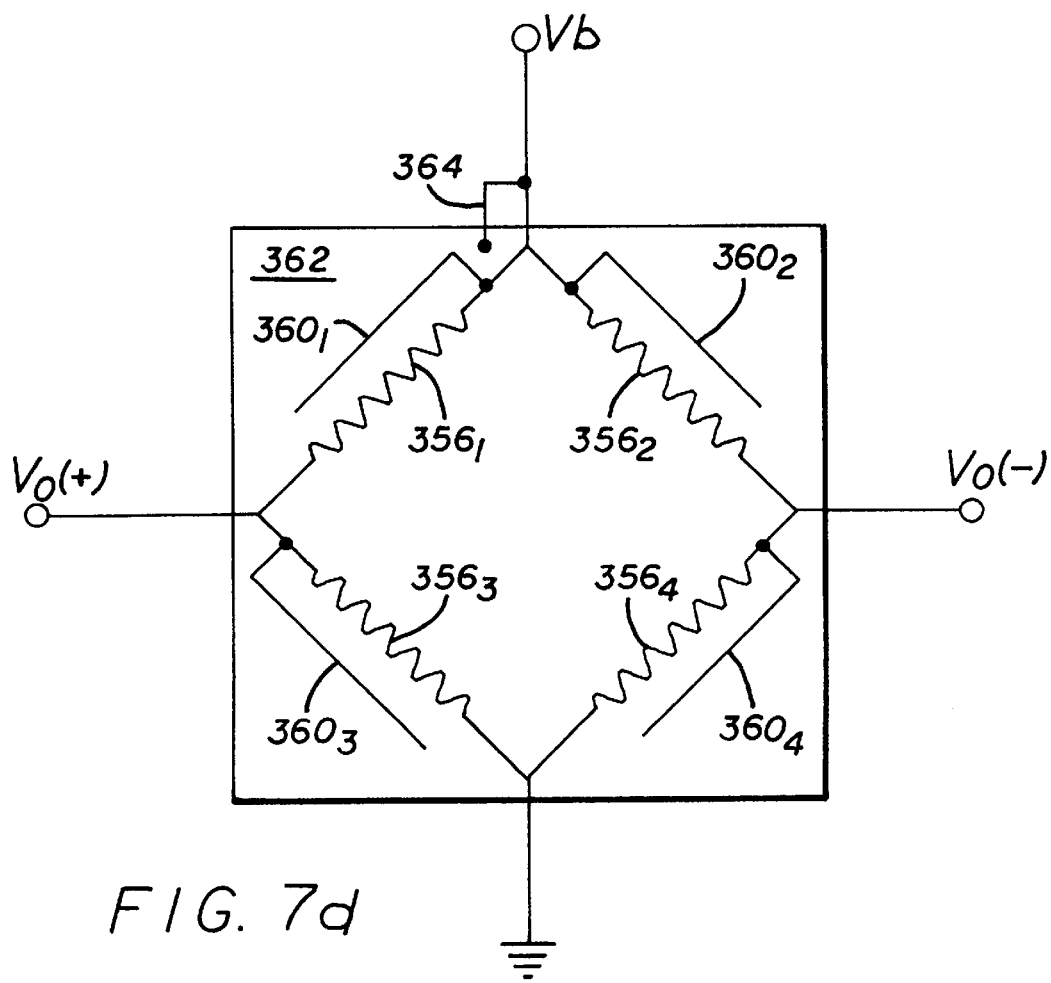
FIG. 7d illustrates a schematic diagram of four diffused piezoresistors formed in a single epi-pocket, where the piezoresistors are connected in a Wheatstone bridge configuration.

FIG. 7d illustrates a schematic diagram of four diffused piezoresistors formed in a single epi-pocket 362, where the piezoresistors are connected in a Wheatstone bridge configuration. Referring to FIG. 7d, the piezoresistors $356_1$–$356_4$ are formed in a single epi-pocket 362, with the epi-pocket being tied to the bridge connection $V_b$, as shown by connection 364. Also shown are local polysilicon shields $360_1$–$360_4$, which are tied to the higher voltage potential of the corresponding piezoresistors $356_1$–$356_4$. Alternatively, a single polysilicon shield may be placed over the four piezoresistors and either tied to the bridge potential or to ground.

The epi-pocket isolation technique provides high performance, reduced leakage, higher temperature operation, improved stability, and direct compatibility with BICMOS processes, particularly when integrated with BICMOS electronics. An epi-pocket surrounding one or more piezoresistors reduces the amount of electrical leakage by minimizing the total surface area surrounding the epi pocket and the periphery at the semiconductor-oxide interface. This implementation also provides reduced leakage by eliminating leakage components at the sides of a sawed off die as in most conventional sensors. Higher temperature operation is obtained as a consequence of the reduced semiconductor leakage paths, and with careful layout of the epi-pockets, the leakage components are common-mode and therefore rejected by the Wheatstone bridge.

Since the piezoresistor is surrounded by a junction isolated N– epi-pocket, which is driven by a low impedance voltage supply, and the N– epi-pocket is further surrounded by a P– sinker diffused region, which can be held at ground potential, protection against detrimental effects of electromagnetic interference and high electric fields is enhanced. Grounding the sinker diffused region and the buried layer is particularly beneficial in the pressure sensor implementation, where electrically conductive fluids may be in direct contact with the back of the silicon die.

The piezoresistors with epi-pocket isolation are selectively fabricated on a silicon die, which is subsequently micro-machined to form stress-enhancing geometries such as pressure sensor diaphragms or accelerometer flexures. The embodiments described herein are compatible with integrated circuit processing, and allow active bipolar and MOS devices to be co-fabricated with the piezoresistor sensor, typically, in a full thickness substrate area, providing a large, buffered output signal with possible on-chip compensation, signal processing, and formatting electronics.

Figure 8A:
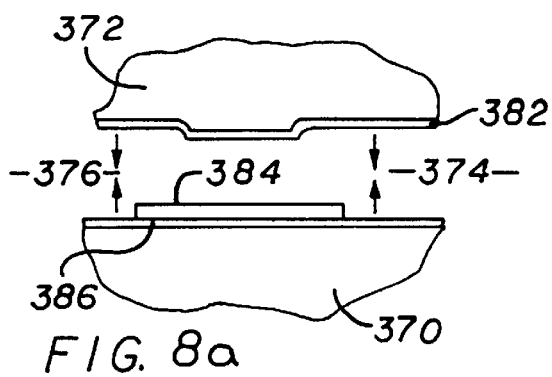

FIGS. 8a–8l illustrate several exemplary wafer-to-wafer bonding approaches using thermocompression bonding (such as, but not limited or restricted to, eutectic bonding). As shown in FIG. 8a, a thin film of germanium 382 is deposited onto a silicon cap wafer 372 and a corresponding aluminum ring 384 is deposited on the sensor die wafer 370 (shown on the field oxide 386). After surface cleaning, the wafers are aligned in a special fixture and inserted into a wafer-to-wafer bonder. Bonding is performed at elevated temperatures while pressing the wafers together. In one embodiment, an aluminum-germanium thermocompression bond is used with a eutectic temperature of 424° C. A vacuum ambient may be incorporated into the cavities by pumping down the bonding chamber prior to elevating the temperature. When the wafers are bonded, predefined recesses and cavities are formed in regions, as shown by numerals 374 and 376.

Figure 8E:
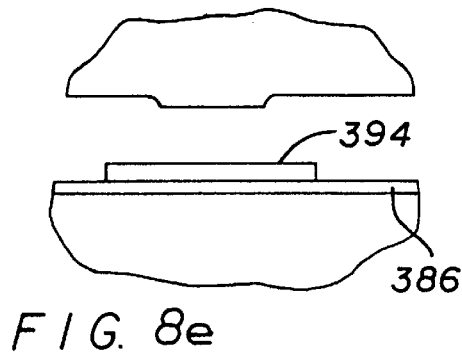
Figure 8B:
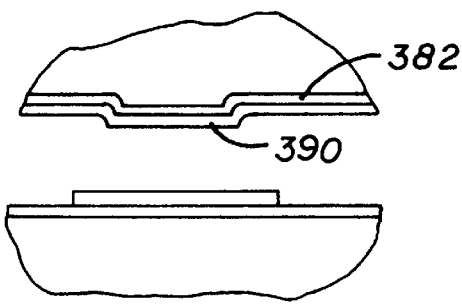

FIG. 8b shows a deposited aluminum film 390 on top of the germanium 382 which provides a protective layer against oxidation of the germanium 382 and allows the same cleaning cycles to be performed on the cap and sensor wafers 370 and 372, respectively. A thermal oxide 392 may optionally be incorporated underneath the germanium 382, as shown in FIG. 8c, and may optionally be incorporated underneath the germanium 382 and the aluminum film 390, as shown in FIG. 8d.

Figure 8F:
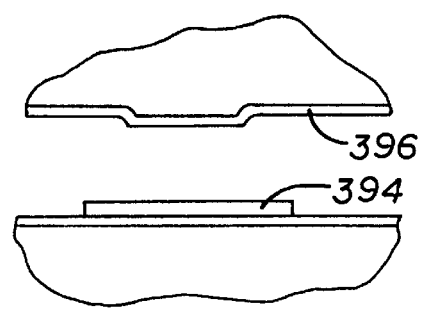
Figure 8C:
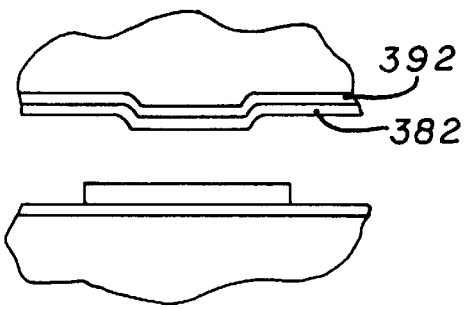
Figure 8G:
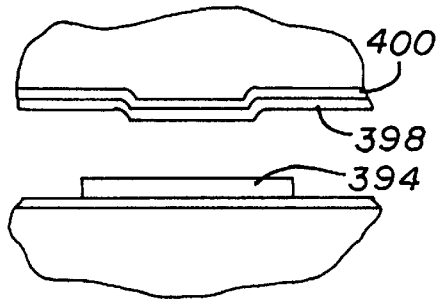
Figure 8D:
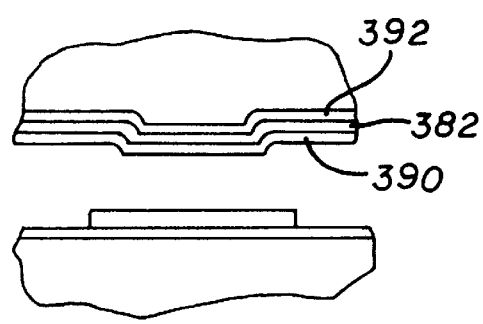
Figure 8H:
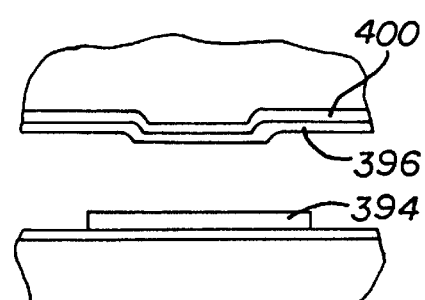

FIGS. 8e–8h illustrate a gold-silicon thermocompression bond. FIG. 8e shows a gold bond ring 394 located on a field oxide 386 of the sensor die wafer 370. FIG. 8f shows that the gold bond ring 394 of the sensor die wafer 370 may be bonded to a thin film of gold 396 deposited onto the silicon cap wafer 372. In one embodiment, the gold-silicon eutectic temperature is at 363° C. In an alternative embodiment, as shown in FIG. 8g, the gold bond ring 394 deposited on the sensor die wafer 370 is bonded to a layer of polysilicon 398, which is deposited on a layer of thermal oxide 400, of the cap wafer 372. FIG. 8h shows a layer of thermal oxide 400 optionally incorporated underneath the gold layer 396 on the silicon cap wafer 372.

In yet another embodiment, a polysilicon bond ring 402 is provided on the sensor die wafer 370 with a field oxide 386 incorporated therebetween, as shown in FIG. 8i. In this embodiment, a layer of gold 396 is deposited on the silicon cap wafer 372 to complete the thermocompression wafer-to-wafer bonding materials. A variation of FIG. 8i includes depositing a layer of gold 394 on top of the polysilicon 402, as shown in FIG. 8j. A further variation of FIG. 8i includes incorporating a layer of thermal oxide 392 underneath the gold layer 396 of the silicon cap wafer 372, as shown in FIG. 8k. FIG. 8l shows the combination of the thermocompression bonding material of the sensor die wafer 370 of FIG. 8j and thermocompression bonding material of the silicon cap wafer 372 of FIG. 8k. Additional adhesion layers and barrier layers may also be included.

FIG. 9 illustrates an exemplary glass film wafer-to-wafer bonding configuration according to another embodiment of the present invention. In this embodiment, a low temperature glass film 404, such as a borophosphosilicate glass, which provides a good seal over underlying metal traces and active devices, is attached to the silicon cap wafer 372. The silicon cap wafer 372 is then pressed onto the sensor die wafer 370 at an elevated temperature, thereby forming a non-conducting seal over metal interconnections (not shown).

The bonding techniques described above solve numerous packaging problems by providing an integral vacuum reference, integral stress isolation flexible region, and compatibility with co-fabricated integrated electronic circuits for a single-chip solution without the requirement for laser trimming. The present invention further includes an optional coating to eliminate costly barrier diaphragms and optional through-wafer vias for top side and/or bottom side interconnection as a surface mounted or ball grid array component.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art.

What is claimed is:

1. A semiconductor pressure sensor, comprising:
   a sensor capsule including
      a semiconductor die having
         a diaphragm region to deflect responsive to applied pressure,
         a nominally rigid rim region to support the periphery of the diaphragm region, an outer frame region, and
a stress isolation region to couple the rim region to the outer frame region, and
a silicon cap that is bonded to the outer frame region of the semiconductor die to cover the diaphragm region; and
a pressure port hermetically attached to the sensor capsule.

2. The semiconductor pressure sensor of claim 1, wherein the silicon cap is bonded to the semiconductor die at a temperature ranging between 25° C. and 550° C.

3. The semiconductor pressure sensor of claim 1, wherein the silicon cap is bonded to the semiconductor die using aluminum and germanium.

4. The semiconductor pressure sensor of claim 1, wherein the silicon cap is bonded to the semiconductor die using gold and polycrystalline silicon.

5. The semiconductor pressure sensor of claim 1, wherein the silicon cap is bonded to the semiconductor die using gold and single-crystal silicon.

6. The semiconductor pressure sensor of claim 1, wherein the silicon cap is bonded to the semiconductor die using a glass bond.

7. The semiconductor pressure sensor of claim 1, wherein the pressure port is hermetically attached to the semiconductor capsule with a eutectic solder that includes gold and tin.

8. The semiconductor pressure sensor of claim 1, wherein pressure port is hermetically attached to the semiconductor capsule with a eutectic solder that includes tin and silver.

9. The semiconductor pressure sensor of claim 1 wherein the silicon cap includes a cavity for allowing the diaphragm to deflect within the cavity.

10. The semiconductor pressure sensor of claim 9 wherein the cavity contains a vacuum.

11. The semiconductor pressure sensor of claim 9 further comprising an additional pressure port for providing gage or differential pressure measurements.

12. The semiconductor pressure sensor of claim 1, wherein the pressure port is molded into a plastic housing.

13. The semiconductor pressure sensor of claim 1, further comprising an active electronic circuit mounted on the semiconductor capsule opposite the pressure port.

14. The semiconductor pressure sensor of claim 13, wherein the active electronic circuit includes one or more of the following circuits: an electronic trimming circuit, a calibration circuit, and a signal conditioning circuit.

15. The semiconductor pressure sensor of claim 1 further comprising integrated circuitry co-fabricated within the sensor capsule.

16. The semiconductor pressure sensor of claim 1 wherein the stress isolation region includes:
a first member including a first end coupled to a frame region of the semiconductor die, and a second end; and
a second member including a first end coupled to the second end of the first member, and a second end coupled to a rim region of the semiconductor die.

17. The semiconductor pressure sensor of claim 16 wherein a first wall etch defines the first member and a second wall etch, in combination with the first wall etch, defines the second member.

18. The semiconductor pressure sensor of claim 9 wherein the diaphragm includes:
a first silicon region of a first conductivity type and a second silicon region of a second conductivity type surrounding the first silicon region; and
a stress-sensitive diffused resistive element formed on the deformable member in the first silicon region.

19. The semiconductor pressure sensor of claim 18 further comprising second, third, and fourth resistive elements, said resistive elements formed on diaphragm in the first silicon region.

20. The semiconductor pressure sensor of claim 19 wherein the resistive elements are connected in a Wheatstone bridge configuration.

21. The semiconductor pressure sensor of claim 18 wherein the first conductivity type is an N− semiconductor material and the second conductivity type is a P− semiconductor material.

22. The semiconductor pressure sensor of claim 18 wherein the silicon region of the first conductivity type is connected to a voltage that is higher than or at the same potential as the resistive element potential.

23. The semiconductor pressure sensor of claim 9 further comprising:
a boss coupled to a first side of the diaphragm along an axis of the diaphragm; and
a plurality of piezoresistors disposed on a second side of the diaphragm in regions not occupied by the boss along the axis.

24. The semiconductor pressure sensor of claim 23, wherein first and second piezoresistors are placed in regions of highest tensile stress along the axis to increase sensitivity of applied pressure.

25. The semiconductor pressure sensor of claim 24, wherein third and fourth piezoresistors are placed in regions of highest compressive stress along the axis to increase sensitivity of applied pressure.

26. The semiconductor pressure sensor of claim 23, wherein the plurality of piezoresistors are oriented perpendicular to the axis.

27. The semiconductor pressure sensor of claim 1 further comprising a media coating over the pressure port and exposed areas of the sensor capsule.

28. The semiconductor pressure sensor of claim 1 wherein the silicon cap and the semiconductor die are bonded together to form a bond region, and wherein the semiconductor die includes a doped region covered by an oxide layer that electrically couples a first region located on one side of the bond region and a second region located on the opposite side of the bond region.

29. A semiconductor pressure sensor, comprising:
a sensor capsule including a semiconductor die and a silicon cap that are bonded together, the semiconductor die including
a diaphragm region to deflect responsive to applied pressure, the diaphragm region including an epi-layer of a first conductivity type adjacent a top die surface and a buried layer of a second conductivity type adjacent the epi-layer and an opposing bottom diaphragm surface, the buried layer being a portion of a substrate of the second conductivity type, the buried layer portion of the substrate being adjacent the surface of the substrate opposite the bottom die surface,
a nominally rigid region coupled to the periphery of the diaphragm region, the rigid region including the epi-layer, the buried layer, and the substrate, and
a piezoresistive sensor with a first portion in the diaphragm region and a second portion in the rigid region, the piezoresistive sensor including
a diffused region of the second conductivity type extending from the top die surface to the buried layer,
an epi-pocket formed by the portion of the epi-layer that is surrounded by the diffused region, and
a piezoresistor of the second conductivity type formed in the epi-pocket adjacent the top die surface;
a pressure port hermetically attached to the sensor capsule with a eutectic solder; and a housing that houses the sensor capsule and the pressure port.

30. The semiconductor pressure sensor of claim 29, wherein the semiconductor die further includes a plurality of piezoresistive sensors connected in a Wheatstone bridge configuration for providing an output signal in direct proportion to applied pressure.

31. The semiconductor pressure sensor of claim 29, wherein the silicon cap includes a cavity such that an intergal vacuum reference is formed when the semiconductor die and the silicon cap are bonded together.

32. The semiconductor pressure sensor of claim 29, wherein the housing is made from one the following plastic materials: liquid crystal polymer and epoxy resin.

33. A semiconductor die, comprising:
   a diaphragm region to deflect responsive to applied pressure, the diaphragm region including an epi-layer of a first conductivity type adjacent a top die surface and a buried layer of a second conductivity type adjacent the epi-layer and an opposing bottom diaphragm surface, the buried layer being a portion of a substrate of the second conductivity type, the buried layer portion of the substrate being adjacent the surface of the substrate opposite the bottom die surface;
   a nominally rigid region coupled to the periphery of the diaphragm region, the rigid region including the epi-layer, the buried layer, and the substrate; and
   a piezoresistive sensor with a first portion in the diaphragm region and a second portion in the rigid region, the piezoresistive sensor including
      a diffused region of the second conductivity type extending from the top die surface to the buried layer;
      an epi-pocket formed by the portion of the epi-layer that is surrounded by the diffused region; and
      a piezoresistor of the second conductivity type formed in the epi-pocket adjacent the top die surface.

34. The semiconductor die of claim 33 wherein the first conductivity type is an N– semiconductor material and the second conductivity type is a P– semiconductor material.

35. The semiconductor pressure sensor of claim 29 wherein the epi-pocket is connected to a voltage that is higher than or at the same potential as the piezoresistor potential.

36. The semiconductor die of claim 33 further comprising an oxide layer adjacent to the piezoresistor, a conductive layer adjacent to the oxide layer such that the oxide layer insulates the conductive layer from the piezoresistor, and an interconnect that electrically connects an end of the piezoresistor to the conductive layer.

37. The semiconductor die of claim 33 further comprising an outer frame region and a stress isolation region to couple the rigid region to the outer frame region.

38. A semiconductor pressure sensor, comprising:
   a sensor capsule including a semiconductor die and a silicon cap that are bonded together, the semiconductor die including
      a diaphragm region to deflect responsive to applied pressure, the diaphragm region including an epi-layer of a first conductivity type adjacent a top die surface and a buried layer of a second conductivity type adjacent the epi-layer and an opposing bottom diaphragm surface,
      a nominally rigid region coupled to the periphery of the diaphragm region, the rigid region including the epi-layer, the buried layer, and the substrate,
      an outerframe region,
      a stress isolation region to couple the rigid region to the outer frame region, and
      a piezoresistive sensor with a first portion in the diaphragm region and a second portion in the rigid region, the piezoresistive sensor including
         a diffused region of the second conductivity type extending from the top die surface to the buried layer,
         an epi-pocket formed by the portion of the epi-layer that is surrounded by the diffused region, and
         a piezoresistor of the second conductivity type formed in the epi-pocket adjacent the top die surface;
   a pressure port hermetically attached to the sensor capsule with a eutectic solder; and
   a housing that houses the sensor capsule and the pressure port.

39. The semiconductor pressure sensor of claim 38, wherein the semiconductor die further includes a plurality of piezoresistive sensors connected in a Wheatstone bridge configuration for providing an output signal in direct proportion to applied pressure.

40. The semiconductor pressure sensor of claim 38, wherein the silicon cap includes a cavity such that an integral vacuum reference is formed when the semiconductor die and the silicon cap are bonded together.

41. The semiconductor pressure sensor of claim 38, wherein the housing is made from one the following plastic materials: liquid crystal polymer and epoxy resin.

42. The semiconductor pressure sensor of claim 38 wherein the epi-pocket is connected to a voltage that is higher than or at the same potential as the piezorsistor potential.

43. A semiconductor die, comprising:
   a diaphragm region to deflect responsive to applied pressure, the diaphragm region including an epi-layer of a first conductivity type adjacent a top die surface and a buried layer of a second conductivity type adjacent the epi-layer and an opposing bottom diaphragm surface;
   a nominally rigid region coupled to the periphery of the diaphragm region, the rigid region including the epi-layer, the buried layer, and a substrate adjacent the buried layer and an opposing bottom die surface;
   an outer frame region;
   a stress isolation region to couple the rigid region to the outer frame region; and
   a piezoresistive sensor with a first portion in the diaphragm region and a second portion in the rigid region, the piezoresistive sensor including
      a diffused region of the second conductivity type extending from the top die surface to the buried layer;
      an epi-pocket formed by the portion of the epi-layer that is surrounded by the diffused region; and
      a piezoresistor of the second conductivity type formed in the epi-pocket adjacent the top die surface.

44. The semiconductor die of claim 43 wherein the substrate is of the second conductivity type and the buried layer is a portion of the substrate.

45. The semiconductor die of claim 43 wherein the first conductivity type is an N– semiconductor material and the second conductivity type is a P– semiconductor material.

46. The semiconductor die of claim 43 wherein the epi-pocket is connected to a voltage that is higher than or at the same potential as the piezoresistor potential.

47. The semiconductor die of claim 43 further comprising an oxide layer adjacent to the piezoresistor, a conductive layer adjacent to the oxide layer such that the oxide layer insulates the conductive layer from the piezoresistor, and an interconnect that electrically connects an end of the piezoresistor to the conductive layer.

* * * * *